Sept. 16, 1958 P. F. SCHEELE 2,852,746

VOLTAGE-CONTROLLED TRANSISTOR OSCILLATOR

Filed Feb. 2, 1956 2 Sheets-Sheet 1

INVENTOR:
Paul F. Scheele
BY
Roland A. Anderson
Attorney

Sept. 16, 1958 P. F. SCHEELE 2,852,746

VOLTAGE-CONTROLLED TRANSISTOR OSCILLATOR

Filed Feb. 2, 1956 2 Sheets-Sheet 2

INVENTOR.
Paul F. Scheele
BY
Roland A. Anderson
Attorney

United States Patent Office 2,852,746

Patented Sept. 16, 1958

2,852,746

VOLTAGE-CONTROLLED TRANSISTOR OSCILLATOR

Paul F. Scheele, Albuquerque, N. Mex., assignor, by mesne assignments, to the United States of America as represented by the United States Atomic Energy Commission Application February 2, 1956, Serial No. 563,161

2 Claims. (Cl. 332—16)

My invention relates to transistor oscillators and in particular to those transistor oscillators whose frequencies vary according to controlling voltages.

Such oscillators are very useful when it is desired to transmit a voltage measurement by radio. In designing an oscillator for that purpose, some difficulty has been encountered in securing ample frequency deviation for an applied voltage along with sine waveform purity. It is well known that oscillators employing resistance and capacitance frequency-determining networks generate a signal whose frequency is easily voltage-controlled, but which is not a pure sine wave. Improvement of waveform purity is frequently effected by filters which add considerably to the physical size of the apparatus. Of course, an oscillator having an inductance-capacitance (L—C) frequency selective circuit is preferred where a sinusoidal signal is demanded, since no filters are necessary, but I have not found such a circuit in the prior art which will allow a frequency deviation in the neighborhood of ±10% of the center frequency and which generates a signal whose frequency varies little with temperature.

It is therefore an object of my invention to provide a voltage-controlled L—C feedback oscillator capable of producing a signal whose frequency varies at least ±9% either side of a center frequency in response to a modulating voltage and whose frequency is exceptionally stable during changes in temperature.

One embodiment of my invention includes a transistor oscillator circuit in which the transistors are active only during part of each oscillatory cycle thereby minimizing any adverse effects on the signal frequency due to the sensitivity of transistors to changes in temperature. The modulator circuit is compensated for temperature changes by a thermistor in the transistor emitter circuit.

Another embodiment of my invention utilizes a special circuit for changing the bias on the transistors of the oscillator circuit to compensate for changes in their internal resistances with temperature.

Figure 1:
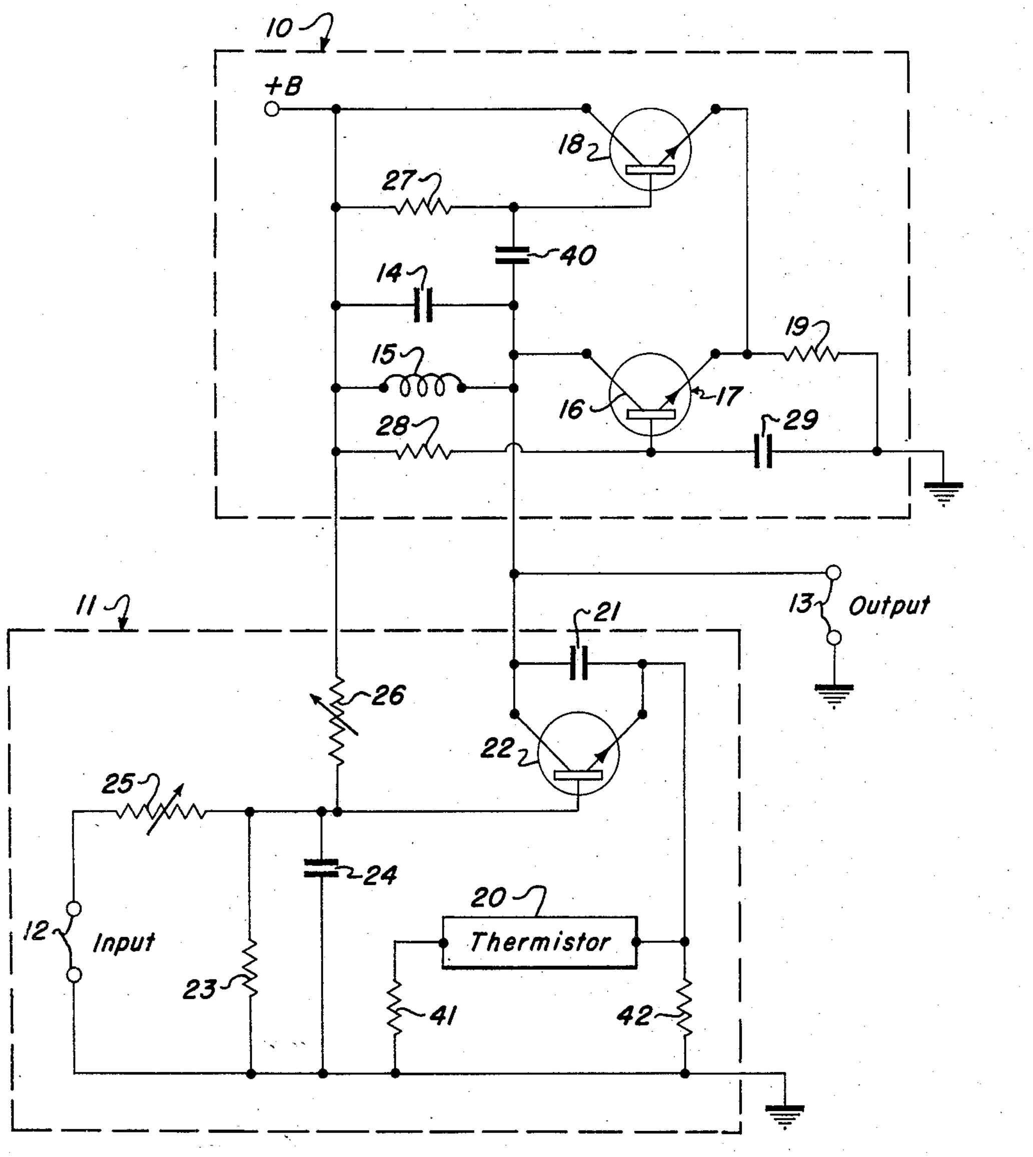
Figure 2:
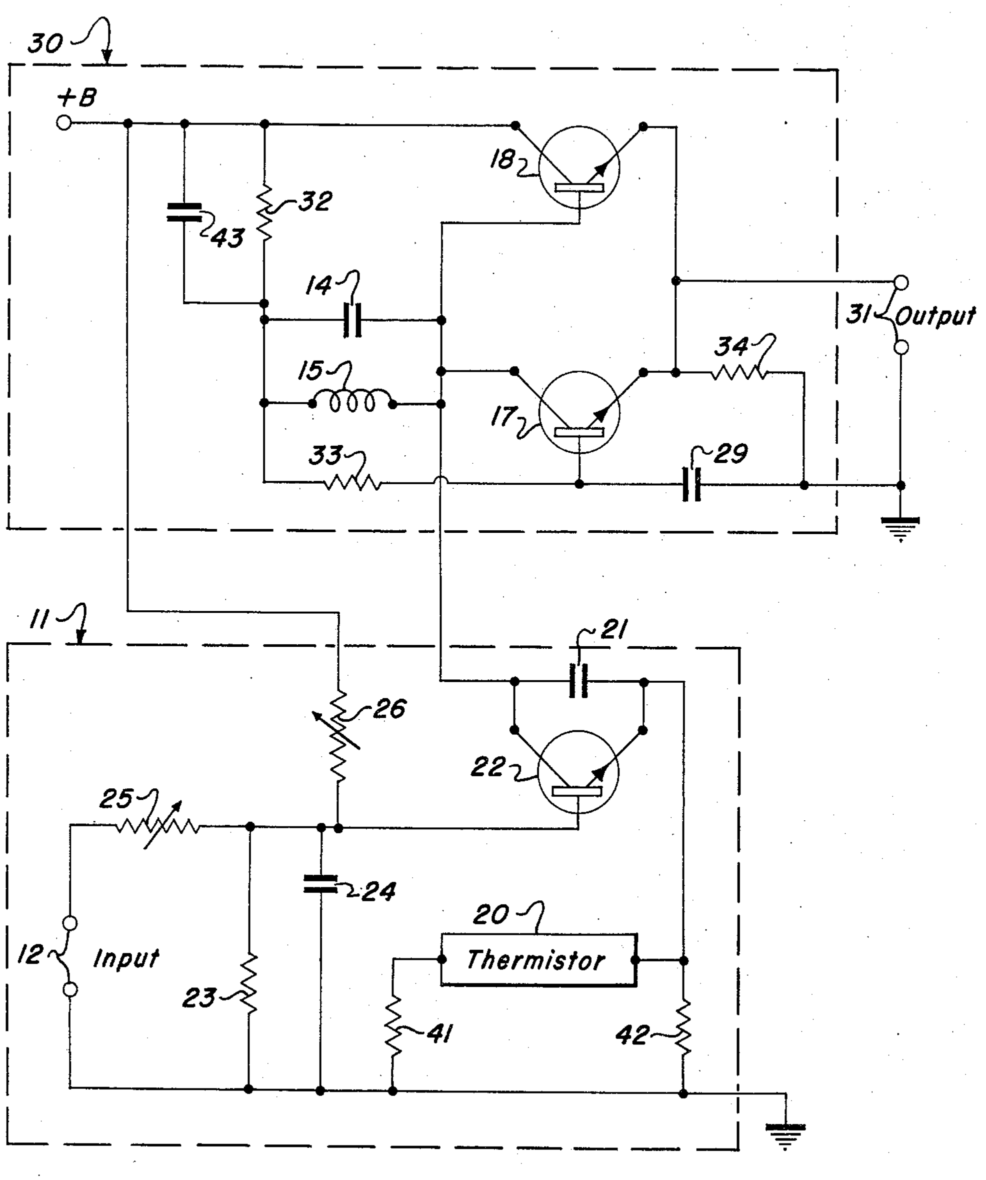

A better understanding of my invention may be had, and other objects will become apparent, by reading the description to follow in conjunction with the attached drawings in which:

Fig. 1 is a circuit diagram of a modulator and oscillator embodying the invention; and Fig. 2 is a circuit diagram of another embodiment capable of delivering a greater signal voltage.

In both figures, like numerals designate like elements.

In Fig. 1 I have shown oscillator circuit 10 coupled to modulator circuit 11 so that the frequency of the oscillatory signal observed at output terminals 13 is modulated in response to a direct or alternating voltage applied to input terminals 12. The oscillator circuit is the feedback type, including transistor 17 connected in a common-base stage and transistor 18 connected in a common-collector stage which is the positive feedback loop.

The common-base circuit, so called because the base electrode is grounded at signal frequencies by capacitor 29 and hence is common to both the input and output circuits, has the properties of stabilized gain and low nonlinear distortion. Therefore it is particuarly useful in the circuit of a stabilized oscillator. The common-collector circuit was chosen for the feedback loop because of its ability to couple a high-impedance circuit to a low-impedance load. As shown, the high-impedance is the parallel-resonant impedance of capacitor 14, inductance 15, and the capacitance of modulator circuit 11, at the desired frequency of oscillation. The low-impedance load is resistor 19. In addition, the common-collector circuit has the same properties of stabilized gain and low nonlinear distortion as does the common-base stage.

The oscillatory signal, then, is coupled from collector 16 of transistor 17 to the base electrode of transistor 18. The amplified signal is returned to transistor 17 by means of resistor 19, which is common to both stages. The returned signal goes through transistor 17 and reaches capacitor 14 and inductance 15 in phase with the original signal, sustaining the oscillations.

Transistors 17 and 18 operate on what is called fixed base current bias. The base electrode of each is connected to +B by a resistor of high resistance compared to the resistance seen looking into the base. Thus changes in the base resistance, which may be caused by temperature changes, have little effect on the value of the base current drawn from +B. In Fig. 1, resistors 27 and 28 are the bias resistors referred to.

The disadvantage of fixed base current bias is that the D. C. operating point varies with the transistor characteristics, causing changes in amplification and thereby in the frequency of oscillation. I have overcome this disadvantage to a great extent by designing oscillator circuit 10 to operate Class B. Thus, with transistors 17 and 18 conducting during only half of each oscillatory cycle, the effect of their characteristics on the waveform and frequency is small. Instead, the waveform is controlled mainly by the frequency-selective network of capacitor 14 and inductance 15 and by modulator circuit 11.

The basic action of the modulator circuit is not new. A description of its operation without temperature compensation may be found on page 134 of the February 1955 issue of Electronics magazine. It is enough to say here that the modulator, by drawing a reactive current from oscillator circuit 10, produces the effect of a variable capacitance shunting capacitor 14 and inductance 15 and thereby changing the resonant frequency of that combination. The amount of capacitance is caused to vary between the full value of capacitor 21 and one-tenth of that according to a modulating voltage applied at input terminals 12. The result is a change in the frequency of the output signal at terminals 13.

Fixed base current bias is again used in the modulator circuit and is supplied to the base electrode of transistor 22 from +B through variable resistor 26. This bias current controls the amount of reactive current drawn by modulator circuit 11 in the absence of a modulating signal at input terminals 12. Hence the setting of resistor 26 determines the starting signal frequency from or about which frequency modulation will occur when a modulating signal is applied.

The sensitivity of the modulator is determined by the setting of variable resistor 25, since it is in a position to attenuate the modulating signal before it reaches the base electrode of transistor 22. The attenuated signal is applied between the base and ground across resistor 23. Capacitor 24 is chosen to be such a value that it appears as a high impedance to the modulating signal but as a very low impedance to the oscillator signal, preventing amplification of the oscillator signal by transistor 22.

Thermistor 20 has the property, as does transistor 22, of decreasing its resistance to the flow of current when its temperature increases. As shown in the circuit, the thermistor acts as a variable resistance to ground from the emitter of transistor 22. When the ambient temperature rises, for instance, the internal resistance of the transistor lowers and the transistor current tries to increase. However, the coincidental lowering of the thermistor resistance allows more current to flow through the thermistor, thus keeping the transistor current substantially constant. An alternative means of temperature compensation is a special temperature compensated capacitor which may be substituted for capacitor 21. In that case, thermistor 20 no longer is needed.

Although I have shown a modulator circuit which draws capacitively reactive current from the oscillator circuit, it should be recognized that my invention is not limited thereto. If capacitor 21 were replaced by a considerably smaller blocking capacitor in series with an inductance, the reactive current drawn would be inductive but the modulation results would be equivalent. This alternative scheme results in increased size and cost of the circuit.

The circuit which I have shown in Fig. 2 includes oscillator circuit 30 which is designed to operate Class A so that more power is delivered to output terminals 31 than is possible under Class B conditions. Abandonment of Class B operation demands a substitute means of temperature compensation to maintain constant frequency, which I have provided in the form of a self-bias.

The bias current for transistor 18 is conducted from +B through resistor 32 and inductance 15 to the base electrode while that for transistor 17 is carried by resistors 32 and 33 to its base electrode. Since the collector of transistor 17 is direct-coupled to the base of transistor 18, the collector current, also, flows through resistor 32, creating a voltage drop across it. Thus the voltage at the junction of resistors 32 and 33 is determined to a large degree by the amount of collector current flowing through transistor 17. This controls the bias current of transistor 17 and, to a lesser degree, the bias of transistor 18.

Therefore, when a temperature change causes the transistor characteristics to vary, the resultant change in the collector current of transistor 17 changes the voltage drop across resistor 32 and with it the bias currents applied to the bases of both transistors. The change in bias relocates the operating point of each transistor so that the impedance presented by the transistors to the frequency-selective network remains substantially constant. Thus the Q of that network remains high, keeping the frequency constant.

The value of capacitor 43 is chosen so that it will bypass the signal to +B, preventing any loss of the signal across resistor 32.

Resistor 34 in Fig. 2 is considerably smaller than the output impedance of the circuit of Fig. 1 and a larger output voltage will develop across it than is available at output terminals 13 of Fig. 1. This allows, in many applications, elimination of a following stage of amplification. The operation of modulator circuit 11 is the same in the circuit of Fig. 2 as in Fig. 1.

My invention has found particular use as part of a telemetering system in which the modulating voltage is derived from a transducer as a measurement of a phenomenon such as pressure. The signal frequency may be within any of the telemetering channels approved by the Research and Development Board. Of these channels, known as subcarrier channels, each has a bandwidth of ±7½% of the center frequency, which is one of seventeen frequencies ranging from four hundred cycles per second to seventy kilocycles per second. It will be obvious to one skilled in the art, however, that my invention is not limited to signals with those frequencies and that, at the present state of the art, the transistors themselves determine the maximum signal frequency.

The following table lists suggested values for the components of the circuit shown in Fig. 1 when it is desired to operate in the subcarrier channel whose center frequency is 3.0 kilocycles per second:

| Reference numeral: | Value or type |
|---|---|
| 14 | .0033 microfarad. |
| 15 | 330 millihenrys. |
| 17 | Type 905. |
| 18 | Type 905. |
| 19 | 200,000 ohms. |
| 20 | "Carboloy" Type D202. |
| 21 | .01 microfarad. |
| 22 | Type 904. |
| 23 | 200,000 ohms. |
| 24 | .1 microfarad. |
| 25 | 500,000 ohms. |
| 26 | 1.5 megohms. |
| 27 | 1 megohm. |
| 28 | 1 megohm. |
| 29 | .1 microfarad. |
| 40 | .01 microfarad. |
| +B | +28 volts. |

The values of resistors 41 and 42, not listed above, are experimentally determined for each oscillator constructed, according to the degree of temperature sensitivity of the particular transistors in the circuit. This procedure has been found necessary due to the variability of transistor characteristics from one transistor to another of the same type which causes different oscillators to have different frequency-temperature characteristics.

The procedure is as follows: Thermistor 20 and resistors 41 and 42 are removed from the circuit and replaced by a calibrated potentiometer having a maximum value of about five hundred ohms. Then the temperature of the entire circuit is stabilized at room temperature, the calibrated potentiometer is set at two hundred ohms, and the signal frequency is set by variable resistor 26. Next the temperature of the circuit is raised to the maximum expected in later use, causing the internal resistances of the transistors to change and resulting in a changed signal frequency. The calibrated potentiometer is adjusted until the signal frequency returns to the original setting and the effective resistance of the potentiometer is noted.

Reference is made next to a family of curves relating the total resistance of the combination replaced by the calibrated potentiometer to temperature, each curve representing the temperature response of a particular combination consisting of thermistor 20 and specific values of resistors 41 and 42. These curves all pass through a point representing two hundred ohms at room temperature (77° F.) and are previously plotted from data calculated with the help of a thermistor calibration curve. A curve for the suggested "Carboloy" Type D202 thermistor may be found in the "Carboloy" Thermistor Manual, which can be obtained from the "Carboloy" department of General Electric Company, Detroit 32, Michigan. I am suggesting the "Carboloy" brand of thermistor merely as a matter of convenience and it should be understood that my invention is not limited to the use thereof.

A point is located in the family of curves having the coordinates of the test temperature and the corresponding setting of the calibrated potentiometer. The individual curve nearest to this point represents the resistance-temperature characteristics of the combination of thermistor 20 and particular values of resistors 41 and 42 which will maintain constant signal frequency over the temperature range. The calibrated potentiometer is then replaced by a thermistor and the indicated values of the resistors and the oscillator is ready for use.

In practice I have used the procedure described, readjusting the signal frequency by means of the calibrated potentiometer at a temperature of +140° F. and installing the resistor values indicated by the curves. I found, upon testing the oscillator circuits over a temperature range from −20° F. to +160° F., that the frequency deviation due to temperature change was only about one percent. It is necessary, at the present state of the art, to use silicon transistors where high temperatures are to be encountered. However germanium transistors will perform equally well within their temperature range. Although I have shown in both of the figures the n-p-n type transistor, the circuits can be accommodated readily to the p-n-p type by one skilled in the art. This and other modifications of the preferred embodiments of my invention may be made without departing from the invention as claimed below.

I claim as my invention:

1. A voltage-controlled oscillator for generating a frequency-modulated sinusoidal signal comprising: a first, a second and a third transistor, each having an emitter, a collector and a base electrode; means for coupling the emitters of the first and of the second transistor so that variations in the current flowing in one of the emitters will vary the current in the other; means for coupling the collector of the first transistor to the base of the second; a frequency-selective load connected to the collector of the first transistor, the base of the first transistor and the collector of the second being maintained at zero signal potential; means for coupling the collectors of the first and third transistors; a reactive load connecting the collector and emitter of the third transistor; means for applying a modulating voltage to the base of the third transistor while maintaining it at zero signal potential; means sensitive to the temperature of the third transistor for varying the emitter circuit resistance of the third transistor to compensate for the variation in the parameters of the third transistor and thereby reduce the frequency deviation of said oscillator due to temperature changes including a thermistor, a first and a second resistor, the first resistor being connected from the emitter of the third transistor to ground in parallel with the series combination of the thermistor and the second resistor; means for setting the frequency of the unmodulated signal and means for biasing each transistor.

2. A voltage-controlled oscillator for generating a frequency-modulated sinusoidal signal comprising: a first, a second and a third transistor, each having an emitter, a collector and a base electrode, the collector of the first transistor being direct-coupled to the base of the second transistor; means for coupling the emitters of the first and of the second transistor so that variations in the current flowing in one of the emitters will vary the current in the other; means for biasing the first and the second transistor including a source of direct current, and a first and a second resistor connected in series between said current source and the base of the first transistor; a frequency-selective load connected in series between the junction of the first and the second resistor and the collector of the first transistor, the base of the first transistor and the collector of the second being maintained at zero signal potential; means for coupling the collectors of the first and third transistors; a reactive load connecting the collector and emitter of the third transistor; means for applying a modulating voltage to the base of the third transistor while maintaining it at zero signal potential; means sensitive to the temperature of the third transistor for varying the emitter circuit resistance of the third transistor to compensate for the variation in the parameters of the third transistor and thereby reduce the frequency deviation of said oscillator due to temperature changes; means for setting the frequency of the unmodulated signal, and means for biasing the third transistor, said biasing means for the first and the second transistor operating to maintain constant operating points for the first and the second transistor regardless of temperature.

References Cited in the file of this patent

UNITED STATES PATENTS 2,681,996 Wallace -------------- June 22, 1954

OTHER REFERENCES

Electronics, February 1955, pp. 133, 134, 135.

Electronics, December 1954, p. 190.